(12) United States Patent
Lin et al.

(10) Patent No.: US 8,144,047 B2
(45) Date of Patent: Mar. 27, 2012

(54) CURRENT-MODE DUAL-SLOPE TEMPERATURE-DIGITAL CONVERSION DEVICE

(75) Inventors: Ming-Tse Lin, Kaohsiung County (TW); Chung-Chih Hung, Tainan County (TW)

(73) Assignee: National Chiao Tung University, Hsinchu (TW)

( * ) Notice: Subject to any disclaimer, the term of this patent is extended or adjusted under 35 U.S.C. 154(b) by 29 days.

(21) Appl. No.: 12/910,303

(22) Filed: Oct. 22, 2010

(65) Prior Publication Data
US 2011/0291871 A1 Dec. 1, 2011

(30) Foreign Application Priority Data
May 25, 2010 (TW) ................. 99116654 A

(51) Int. Cl.
*H03M 1/82* (2006.01)
(52) U.S. Cl. .............. 341/167; 341/155; 341/166
(58) Field of Classification Search .......... 341/155, 341/166–167
See application file for complete search history.

(56) References Cited

U.S. PATENT DOCUMENTS

| | | | |
|---|---|---|---|
| 5,982,221 A | 11/1999 | Tuthill | |
| 6,019,508 A | 2/2000 | Lien | |
| 6,111,533 A | 8/2000 | Yuan et al. | |
| 6,377,110 B1 | 4/2002 | Cooper | |
| 6,962,436 B1 * | 11/2005 | Holloway et al. | 374/170 |
| 7,173,501 B1 | 2/2007 | Varricchione | |
| 7,372,392 B1 * | 5/2008 | Wan et al. | 341/172 |
| 7,413,342 B2 * | 8/2008 | Mukherjee | 374/170 |
| 2007/0126619 A1 | 6/2007 | McGrath | |
| 2008/0095213 A1 | 4/2008 | Lin et al. | |

OTHER PUBLICATIONS

Chen et al., "A Time-to-Digital-Converter-Based CMOS Smart Temperature Sensor," IEEE Journal of Solid-State Circuits, Aug. 2005, pp. 1642-1648, vol. 40, No. 8.
Lin et al., An Ultra Low Power 1V, 220nW Temperature Sensor for Passive Wireless Applications, IEEE Custom Integrated Circuits Conference (CICC), Aug. 2008, pp. 507-510.
Woo et al., "Dual-DLL-Based CMOS All-Digital Temperature Sensor for Microprocessor Thermal Monitoring," IEEE International Solid-State Circuits Conference, Feb. 2009, pp. 68-69, vol. 3.

* cited by examiner

*Primary Examiner* — Khai M Nguyen
(74) *Attorney, Agent, or Firm* — Muncy, Geissler, Olds & Lowe, PLLC

(57) ABSTRACT

A current mode dual-slope temperature-to-digital conversion device is disclosed. The conversion device comprises a temperature dependent current source and a reference current source. Firstly, a capacitor is charged by the temperature dependent current source. Next, the capacitor is discharged by the reference current source. The capacitor is coupled to at least one trigger, and the trigger sends out a first digital signal to a logic controller by the voltage of the capacitor. Then, the logic controller sends out a second digital signal to a time-to-digital converter according to the first digital signal. When the capacitor is discharged by the reference current source and before the first digital signal is varied, the converter receives the second digital signal and a clock signal to generate a corresponding digital output value. The present invention achieves the requirement of the high linearity resolution with the dual-slope architecture lest the curvature effect resulted from the time-domain circuit be occurred.

10 Claims, 3 Drawing Sheets

CURRENT-MODE DUAL-SLOPE TEMPERATURE-DIGITAL CONVERSION DEVICE

BACKGROUND OF THE INVENTION

1. Field of the Invention

The present invention relates to a conversion device, particularly to a current-mode dual-slope temperature-digital conversion device.

2. Description of the Related Art

The daily-life appliances usually need temperature data, such as air conditioners, refrigerators, and fire warning systems. Temperature is measured via detecting the variation of a physical property, such as resistance variation, color variation, volume variation or electromotive force generated by magnetic flux change. The electric conductivity of a semiconductor material is greatly influenced by temperature. Therefore, the electric conductivity of an integrated circuit made of semiconductor materials correlates with temperature. The temperature characteristic curve of an integrated circuit is thus used to fabricate a temperature-sensing integrated circuit.

Refer to FIG. 1. A general temperature sensor comprises a temperature-dependent sensor 10, a reference source circuit 12 and an analog-to-digital converter (ADC) 14. The temperature-dependent sensor 10 generates temperature-dependent voltage or temperature-dependent current. The reference source circuit 12 generates temperature-independent reference voltage or temperature-independent reference current. The analog-to-digital converter 14 converts the voltage difference or current difference between the temperature-dependent sensor 10 and the reference source circuit 12 into digital signals.

The temperature sensors may be categorized into two systems: the voltage-domain system and the time-domain system. For the voltage-domain system, a complicated calibration circuit is needed to achieve high precision and high accuracy at a given operation voltage. The complicated calibration circuit should increase the time and cost of development, consume more power, and impair portability of products. The time-domain system is neither limited by voltage swing nor dependent on an additional calibration circuit. However, the time-domain system has some problems in the curvature of the conversion curve because the time-domain system adopts an inverter or a delay element as the temperature-dependent sensor.

Accordingly, the present invention proposes a current-mode dual-slope temperature-digital conversion device to overcome the abovementioned problems.

SUMMARY OF THE INVENTION

The primary objective of the present invention proposes a current-mode dual-slope temperature-digital conversion device, which uses a dual-slope approach to implement temperature-digital conversion, whereby is avoided the curvature effect occurring in the conventional time-domain system, and whereby is achieved high precision of a high linear relationship.

Another objective of the present invention proposes a current-mode dual-slope temperature-digital conversion device, wherein a current-type integrator, which is formed of current sources and capacitors, replaces the conventional amplification-type integrator, and wherein the inverter, which is small-size, power-saving and less sensitive to temperature, replaces the conventional comparator, whereby is achieved compactness and high power efficiency.

To achieve the abovementioned objectives, the present invention proposes a current-mode dual-slope temperature-digital conversion device, which comprises a first switch and a second switch, which are cascaded to each other and controlled by a group of non-overlapped control signals. A temperature-dependent current source and a reference current source are respectively connected with the first and second switches. The temperature-dependent current source and the reference current source respectively generate a temperature-dependent current and a reference current. One terminal of a capacitor is connected with the first switch and the second switch; another terminal of the capacitor is connected with a reference voltage. When the first switch is turned on, the temperature-dependent current charges the capacitor. When the second switch is turned on, the reference current discharges the capacitor. The first switch, the second switch and the capacitor are connected with the input terminal of at least one trigger. The trigger is connected with a trigger voltage. The trigger compares the trigger voltage and the terminal voltage of the capacitor and outputs a first digital signal. The trigger may be realized with an inverter. A logical controller is connected with the output terminal of the trigger and the second switch. The logical controller receives the first digital signal and outputs a second digital signal according to the switching state of the second switch and the first digital signal. The logical controller is further connected with a time-digital converter. When the reference current discharges the capacitor, and before the first digital signal varies, the time-digital converter receives the second digital signal and a clock signal and uses the clock signal to work out the number of the corresponding clock cycles according to the second digital signal and then generates an output digital value.

Below, the embodiments are described in detail in cooperation with the drawings to make easily understood technical contents, characteristics and accomplishments of the present invention.

DETAILED DESCRIPTION OF THE INVENTION

Figure 1:
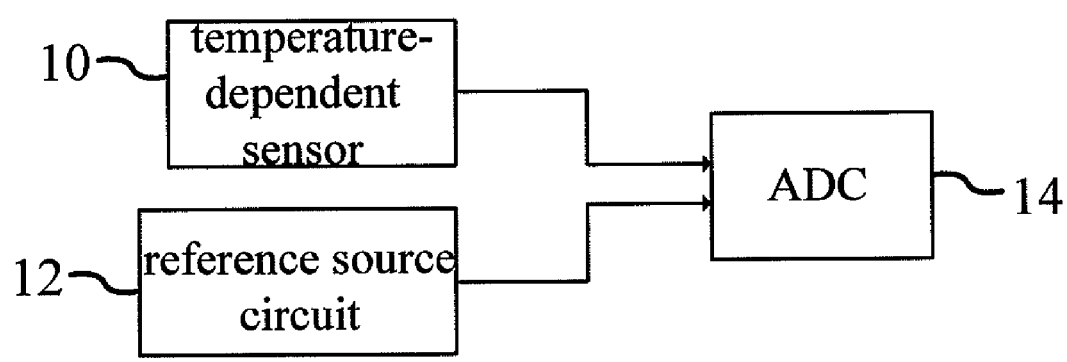
FIG. 1 is a block diagram schematically showing the circuit of a conventional temperature sensing device.
Figure 2:
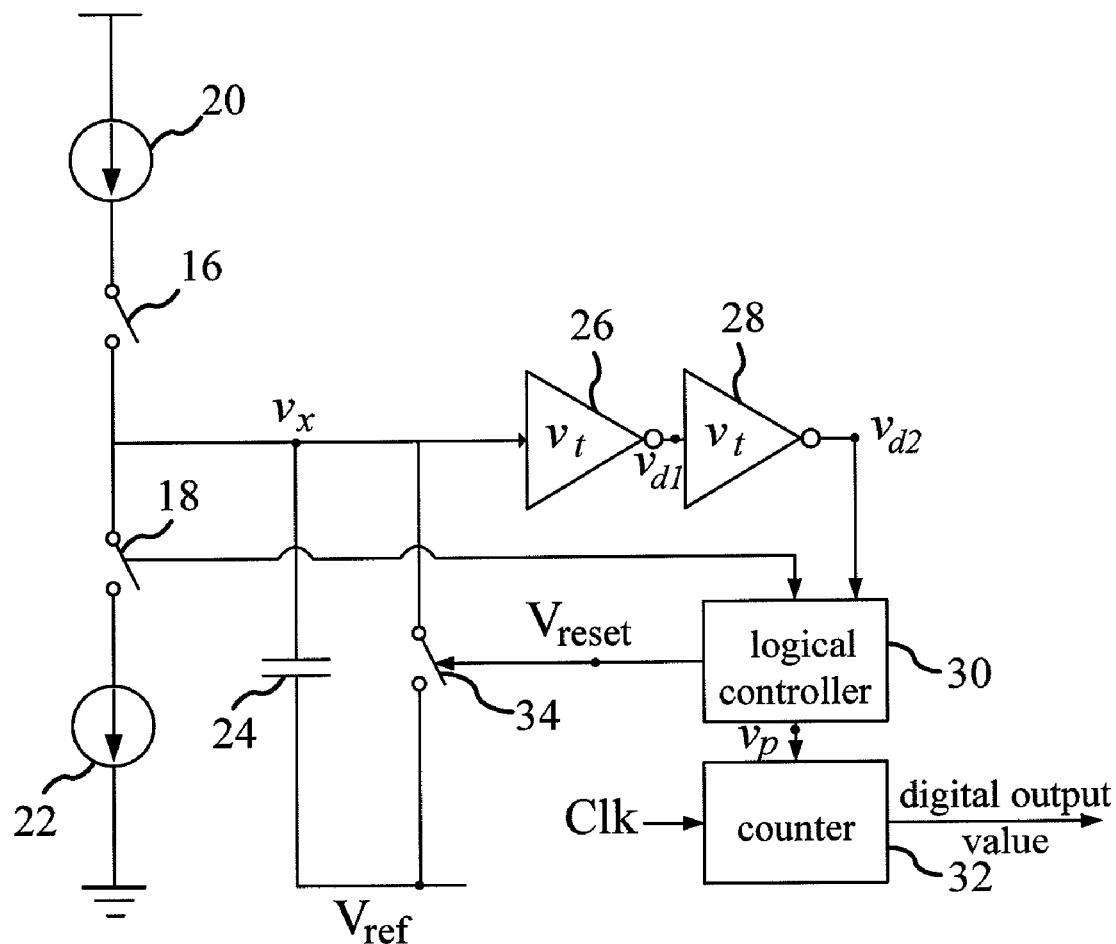
FIG. 2 is a block diagram schematically showing the circuit of a current-mode dual-slope temperature-digital conversion device according to the present invention.

Refer to FIG. 2. The current-mode dual-slope temperature-digital conversion device of the present invention comprises a first switch 16 and a second switch 18, which are controlled by a group of non-overlapped control signals. When the first switch 16 is turned on, the second switch 18 is turned off. When the first switch 16 is turned off, the second switch 18 is turned on. Alternatively, the first and second switches 16 and 18 can be turned off simultaneously, but they cannot be turned at the same time. The first switch 16 and the second switch 18 are respectively connected with a reference current source 20 and a temperature-dependent current source 22. Both the reference current source 20 and the temperature-dependent current source 22 are direct current sources. The reference current source 20 generates a reference current. The temperature-dependent current source 22 generates a temperature-dependent current proportional to the temperature. The higher the temperature, the greater the temperature-dependent current. The lower the temperature, the smaller the temperature-dependent current.

The present invention further comprises at least one trigger. The at least one trigger is exemplified by two cascade inverters 26 and 28 in FIG. 2. Both the first and second switches 16 and 18 are coupled to one terminal of a capacitor 24 and the input terminal of the inverter 26. Another terminal of the capacitor 24 is coupled to a reference voltage. When the first switch 16 is turned on, the temperature-dependent current charges the capacitor 24. When the second switch 18 is turned on, the reference current discharges the capacitor 24.

A switching voltage $V_t$ is coupled to each of the two inverters 26 and 28 to function as a trigger voltage. The switching voltage $V_t$ is greater than the reference voltage $V_{ref}$. The output terminal of the inverter 20 is coupled to a logical controller 30. The inverter 26 compares the terminal voltage of the capacitor 24 and the switching voltage $V_t$ and outputs a first digital signal. The inverter 28 receives the first digital signal, compares the first digital signal with the switching voltage $V_t$, and outputs a second digital signal to the logic controller 30.

The conversion device of the present invention adopts a current-type integrator formed of the current sources 20 and 22 and the capacitor 24. The current-type integrator not only can replace the conventional amplification-type integrator but also applies to the CMOS (Complementary Metal Oxide Semiconductor) design. As the current-type integrator uses the inverters that are small-size, power-saving and less sensitive to temperature, to replace the conventional power-consuming comparators. Therefore, the conversion device has advantages of compactness and high power efficiency.

The logical controller 30 is coupled to the second switch 18 and a time-to-digital converter, which is exemplified by a counter 32 in FIG. 2. The logical controller 30 receives the second digital signal and outputs a third digital signal according to the second digital signal and the switching state of the second switch 18. When the reference current discharges the capacitor 24, and before the second digital signal varies, the counter 32 receives the third digital signal and a clock signal Clk. The counter 32 works out the number of the clock cycles from the clock signal Clk according to the DC level of the third digital signal and then generates the corresponding count as the output digital value.

The capacitor 24 is connected with a reset switch 34 in parallel. The reset switch 34 is coupled to the reference voltage $V_{ref}$ and the logical controller 30. Before the temperature-dependent current charges the capacitor 24, and after the counter 32 outputs the count, the logical controller 30 instantaneously turns on the reset switch 34 to make the terminal voltage of the capacitor 24 lower than the reference voltage $V_{ref}$.

Figure 3:
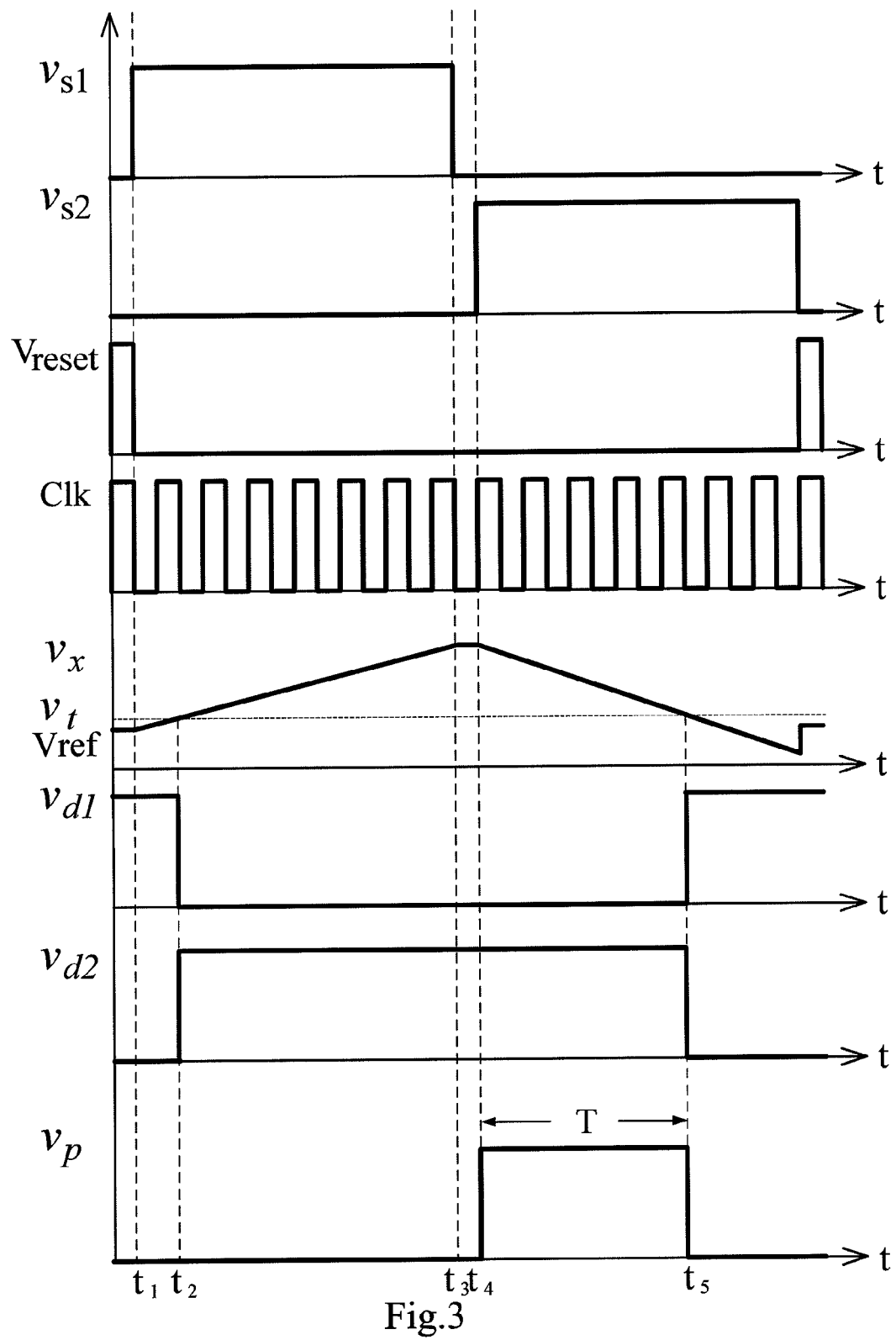
FIG. 3 is a diagram showing the waveforms of various signals used in the present invention.

Refer to FIG. 3. The meanings of the waveforms in FIG. 3 will be explained firstly. As mentioned above, the first and second switches 16 and 18 are controlled by a group of non-overlapped signals. $V_{s1}$ denotes the voltage of the signal controlling the first switch 16. When the voltage $V_{s1}$ is at a high level, the first switch is turned on. When the voltage $V_{s1}$ is at a lower level, the first switch 16 is turned off. $V_{s2}$ denotes the voltage of the signal controlling the second switch 18. When the voltage $V_{s2}$ is at a high level, the second switch 18 is turned on. When the voltage $V_{s2}$ is at a low level, the second switch 18 is turned off. $V_{reset}$ is the voltage between the logical controller 30 and the reset switch 34. While the voltage $V_{reset}$ is at a high level, the logical controller 30 turns on the reset switch 34. While the voltage $V_{reset}$ is at a low level, the logical controller 30 turns off the reset switch. $V_X$ denotes the terminal voltage of the capacitor 24. $V_t$ denotes the switching voltage of the inverter 26 or the inverter 28. $V_{d1}$ denotes the voltage of the first digital signal. $V_{d2}$ denotes the voltage of the second digital signal. $V_p$ denotes the voltage of the third digital signal.

Before the time point $t_1$, both $V_{s1}$ and $V_{s2}$ are at a low level, and $V_{reset}$ is at a high level. Therefore, the first switch 16 and the second switch 18 are turned off. The logical controller 30 turns on the reset switch 34 instantaneously. The terminal voltage $V_X$ of the capacitor 24 is equal to $V_{ref}$. The inverter 26 compares $V_X$ with $V_t$. As $V_X$ is smaller than $V_t$, the inverter 26 outputs a first digital signal having a voltage $V_{d1}$ at a high level. The inverter 28 receives the first digital signal and outputs a second digital signal having a voltage $V_{d2}$ at a low level. As the second switch 18 is turned off, the logical controller 30 outputs a third digital signal having a voltage $V_p$ at a low level.

At the time point $t_1$, $V_{s1}$ rises from a low level to a high level, and $V_{s2}$ is at a low level. Therefore, the first switch 16, which is originally turned off, is turned on, and the second switch 18 is still turned off. Meanwhile, $V_X$, $V_{d1}$, $V_{d2}$ and $V_p$ are maintained at the original values.

Between the time point $t_2$ and the time point $t_3$, $V_{s1}$ is at a high level, and $V_{s2}$ is at a low level. Therefore, the first switch 16 is turned on, and the second switch 18 is turned off. Meanwhile, the temperature-dependent current is still charging the capacitor 24, and $V_X$ is greater than $V_t$. The inverter 26 compares $V_X$ with $V_t$ and outputs a first digital signal having a low-level voltage $V_{d1}$. The inverter 28 receives the first digital signal and outputs a second digital value having a high-level voltage $V_{d2}$. As the second switch 18 is turned off, the logical controller 30 outputs a third digital signal having a low-level voltage $V_p$.

At the time point $t_3$, $V_{s1}$ drops from a high level to a low level. Therefore, the first switch 16, which is originally turned on, is turned off, and the second switch 18 is still turned off. Meanwhile, the temperature-dependent current stops charging the capacitor 24, and $V_X$ no more increases but is maintained at a given value. At the same time, $V_X$ is greater than $V_t$. The inverter 26 compares $V_X$ with $V_t$ and outputs a first digital signal having a low-level voltage $V_{d1}$. The inverter 28 receives the first digital signal and outputs a second digital signal having a high-level voltage $V_{d2}$. As the second switch 18 is turned off, the logical controller 30 outputs a third digital signal having a low-level voltage $V_p$.

Between the time point $t_3$ and the time point $t_4$, $V_{s1}$ is at a low level, and $V_{s2}$ is also at a low level. Therefore, the first switch 16 is turned off, and the second switch 18 is also turned off. At this time, $V_X$ is greater than $V_t$. The inverter 26 compares $V_X$ with $V_t$ and outputs a first digital signal having a low-level voltage $V_{d1}$. The inverter 28 receives the first digital signal and outputs a second digital signal having a high-level voltage $V_{d2}$. As the second switch 18 is turned off, the logical controller 30 outputs a third digital signal having a low-level voltage $V_p$.

At the time point $t_4$, $V_{s1}$ is at a low level, but $V_{s2}$ rises from a low level to a high level. Therefore, the first switch 16 is still turned off, but the second switch 18, which is originally turned off, is turned on. At this time, $V_X$, $V_{d1}$ and $V_{d2}$ are maintained at their original values. As the second switch 18, which is originally turned off, is turned on, the voltage $V_p$ of the third signal output by the logical controller 30 rises from a low-level to a high level.

Between the time point $t_4$ and the time point $t_5$, $V_{s1}$ is at a low level, and $V_{s2}$ is at a high level. Therefore, the first switch 16 is turned off, and the second switch 18 is turned on. The reference current, which is generated by the reference current source 22, discharges the capacitor 24. Thus, $V_X$ decreases at a given slope. However, $V_X$ is still greater than $V_t$ at this time interval. The inverter 26 compares $V_X$ with $V_t$ and outputs a first digital signal having a low-level voltage $V_{d1}$. The inverter 28 receives the first digital signal and outputs a second digital signal having a high-level voltage $V_{d2}$. As the state of the second switch 18 and the value of the voltage $V_{d2}$ are maintained unchanged, the logical controller 30 outputs a third digital signal having a high-level voltage $V_p$.

At the time point $t_5$, $V_{s1}$ is at a low level, and $V_{s2}$ is at a high level. Therefore, the first switch 16 is turned off, and the second switch 18 is turned on. The reference current discharges the capacitor 24. At this time, $V_X$ equals $V_t$. Thus, the inverters 26 and 28 are triggered. The voltage $V_{d1}$ of the first digital signal output by the inverter 26 rises from a low level to a high level. The voltage $V_{d2}$ of the second digital signal output by the inverter 28 drops from a high level to a low level. Therefore, the voltage $V_p$ of the third signal output by the logical controller 30 drops from a high level to a low level.

In the time interval between $t_4$ and $t_5$, the counter 32 receives the high-level third digital signal and the clock signal, works out the number of the corresponding clock cycles according to the high level of the third digital signal and then generates the corresponding count as the output digital value.

The higher the temperature, the greater the temperature-dependent current, and the steeper the charging slope between $t_1$ and $t_3$. The steeper the charging slope, the greater the value of $V_X$ at the time point $t_3$. In such a case, the time interval T where $V_p$ is at a high level also elongates with $V_X$ for a given reference current. Thus, the count output by the counter 32 also increases because the number of the clock cycles is proportional to the time interval T. The present invention realizes the temperature-digital conversion, using the dual-slope characteristic of the charging current and the discharging current. Thus, the present invention not only is exempted from the curvature effect generated by the delay element in the conventional time-domain system but also has high precision of a linear relationship.

After the time point $t_5$, and before the first switch 16 is turned on once again, the logical controller 30 has to control the reset switch 34 to turn on instantaneously to restore $V_X$ to the level of $V_{ref}$—the initial voltage of charging the capacitor 24.

In the embodiments described above, the trigger is realized with the inverters 26 and 28. The trigger may be alternatively realized with a comparator. In such a case, the positive input terminal of the comparator is coupled to the capacitor 24, and the negative input terminal is coupled to the switching voltage $V_t$ functioning as a trigger voltage. The output terminal of the comparator is coupled to the logical controller 30. The comparator compares the terminal voltage of the capacitor 24 with the switching voltage and outputs the abovementioned second digital signal having a voltage of $V_{d2}$.

In conclusion, the present invention not only achieves high precision of a linear relationship but also has advantages of compactness and high power efficiency.

The embodiments described above are only to exemplify the present invention but not to limit the scope of the present invention. Any equivalent modification or variation according to the technical contents, characteristics or spirit of the present invention is to be also included within the scope of the present invention.

What is claimed is:

1. A current-mode dual-slope temperature-digital conversion device comprising
    a first switch;
    a second switch connected with said first switch, wherein said first switch and said second switch are controlled by a group of non-overlapped control signals;
    a temperature-dependent current source connected with said first switch and generating a temperature-dependent current;
    a reference current source connected with said second switch and generating a reference current;
    a capacitor with one terminal connected with said first switch and said second switch and with another terminal connected with a reference voltage, wherein when said first switch is turned on, said temperature-dependent current charges said capacitor, and wherein when said second switch is turned on, said reference current discharges said capacitor;
    at least one trigger with an input terminal connected with said first switch, said second switch and said capacitor, setting a trigger voltage, comparing a terminal voltage of said capacitor with said trigger voltage and outputting a first digital signal;
    a logical controller connected with an output terminal of said trigger and said second switch, receiving said first digital signal, outputting a second digital signal according to a switching state of said second switch and said first digital signal; and
    a time-to-digital converter receiving said second digital and a clock signal, working out a count of clock cycles corresponding to said clock signal according to said second digital signal, and generating a digital output value corresponding to said count when said reference current discharges said capacitor and before said first digital signal varies.

2. The current-mode dual-slope temperature-digital conversion device according to claim 1, wherein said trigger is realized with a single comparator, and wherein a positive input terminal of said comparator is connected with said capacitor, and wherein a negative input terminal of said comparator is connected with a switching voltage functioning as said trigger voltage, and wherein an output terminal of said comparator is connected with said logical controller, and wherein said comparator compares said terminal voltage of said capacitor with said switching voltage and outputs said first digital signal.

3. The current-mode dual-slope temperature-digital conversion device according to claim 1, wherein said trigger is realized with two cascaded inverters, and wherein each said inverter sets a switching voltage functioning as said trigger voltage, and wherein one said inverter has an input terminal connected with said capacitor, compares a terminal voltage of said capacitor and said switching voltage and outputs a third digital signal, and wherein the other said inverter has an output terminal connected with said logical controller, receives said third digital signal, compares said third digital signal with said switching voltage and outputs said first digital signal to said logical controller.

4. The current-mode dual-slope temperature-digital conversion device according to claim 1, wherein when said second switch is turned off, said second digital signal is at a low level.

5. The current-mode dual-slope temperature-digital conversion device according to claim 1, wherein when said second switch, which is originally turned off, is turned on, said second digital signal rises from a low level to a high level.

6. The current-mode dual-slope temperature-digital conversion device according to claim 5, wherein when said second switch is turned on, and when said first digital signal drops from a high level to a low level, said second digital signal also drops from a high level to a low level.

7. The current-mode dual-slope temperature-digital conversion device according to claim 1, wherein according to a high level of said second digital signal, said time-to-digital converter uses said clock signal to work out said count of said clock cycles corresponding to said clock signal and generates said digital output value corresponding to said count.

8. The current-mode dual-slope temperature-digital conversion device according to claim 1 further comprising a reset switch connected with said capacitor in parallel and coupled to said reference voltage and said logical controller, wherein said logical controller turns on said reset switch instantaneously to control said terminal voltage of said capacitor to be at said reference voltage before said temperature-dependent current charges said capacitor and after said time-to-digital converter outputs said digital output value.

9. The current-mode dual-slope temperature-digital conversion device according to claim 1, wherein said time-to-digital converter is a counter, and wherein according to a direct-current level of said second digital signal, said counter uses said clock signal to work out said count of said clock cycles corresponding to said clock signal to function as an attribute value and uses said attribute value as said digital output value.

10. The current-mode dual-slope temperature-digital conversion device according to claim 1, wherein both said temperature-dependent current source and said reference current source are direct-current sources.

* * * * *